United States Patent [19]

Hovel

[11] 4,289,920

[45] Sep. 15, 1981

[54] MULTIPLE BANDGAP SOLAR CELL ON TRANSPARENT SUBSTRATE

[75] Inventor: Harold J. Hovel, Katonah, N.Y.

[73] Assignee: International Business Machines Corporation, Armonk, N.Y.

[21] Appl. No.: 161,816

[22] Filed: Jun. 23, 1980

[51] Int. Cl.³ .............................................. H01L 31/06
[52] U.S. Cl. .................... 136/246; 136/244; 136/255; 136/256; 357/15; 357/30
[58] Field of Search ............. 136/244, 246, 255, 256, 136/259; 357/15, 30

[56] References Cited

U.S. PATENT DOCUMENTS

| | | | |
|---|---|---|---|
| 4,070,206 | 1/1978 | Kressel et al. | 136/255 |
| 4,094,704 | 6/1978 | Milnes | 136/244 |
| 4,244,750 | 1/1981 | Chenevas-Paule et al. | 136/255 |

FOREIGN PATENT DOCUMENTS 1129220  1/1957  France ............................... 136/244

OTHER PUBLICATIONS

K. D. Rasch et al., "Advanced Thin Silicon Solar Cell with Controlled Optical Absorptance", *Proceedings, 2nd European Community Photovoltaic Solar Energy Conference,* Berlin, 1979, Reidel Publishing Co. (1979).

L. A. Hussain, "Back-Reflection Effect on the Long Wavelength Response of Solar Cells", *J. Phys. D. Appl. Phys.,* vol. 11, pp.1535–1537 (1978).

D. Redfield, "Multiple-Pass Thin Film Silicon Solar Cell," *Appl. Phys. Lett.,* vol. 25, pp. 647–648 (1974).

*Primary Examiner*—Aaron Weisstuch
*Attorney, Agent, or Firm*—Bernard N. Wiener

[57] ABSTRACT

The disclosure provides a highly efficient e.g., up to 40% efficiency, solar cell for solar energy concentrator use. Two solar cell layers comprised of different semiconductor materials are grown upon a transparent, insulating substrate. A metal layer covering the bottom serves to reflect light back through the structure, and can serve as a wrap-around electrical contact to both materials. As an example, a structure of Si and GaAlAs is produced on a substrate from the group consisting of $Al_2O_3$, Spinel, Quartz and BeO.

10 Claims, 4 Drawing Figures

MULTIPLE BANDGAP SOLAR CELL ON TRANSPARENT SUBSTRATE

DESCRIPTION

Technical Field of the Invention

This invention relates to solar cells, and more particularly it relates to solar cells with a tandem structure.

Related Patent Application

U.S. patent application Ser. No. 161,820 by T. I. Chappell and J. Woodall, which is commonly assigned and was filed simultaneously herewith, discloses and claims related technology. The invention thereof is applicable for practice with the invention hereof. Illustratively, features of Ser. No. 161,820 which may be included herewith are: a graded layer in the upper cell of the tandem structure and heterojunctions in one or both of the cells to enhance efficiency of conversion from solar energy to electrical energy.

BACKGROUND OF THE INVENTION

H. Hovel, in "Novel Materials and Devices for Sunlight Concentrating Systems", IBM J. Res. and Dev., 22, 112, (1978), describes the advantages of "multicolor" solar cells. By using several materials with different energy bandgaps in optical series, the usual energy losses which limit solar cell efficiencies to less than 30% are overcome. Efficiencies approaching or above 40% can be achieved by practice of this invention. Conventional schemes for producing cascade cells involve growing one material upon another, to overcome material mismatch problems.

In cases where monocrystalline semiconductor layers are desired and the lattice parameters of the semiconductors are not close enough to the parameters of the substrate to ensure low defect densities and good electrical properties, a crystal perfection accommodation region as outlined in U.S. patent application Ser. No. 968,887, now U.S. Pat. No. 4,202,704 filed Dec. 13, 1978, can be used to improve the properties of the semiconductor solar cell layers. A crystal perfection accommodation region may be another semiconductor, for example, which reduces the stresses and defects that would otherwise result from the lattice mismatch between the substrate and the semiconductor solar cell layers on both sides of the substrate.

Semiconductors grown upon foreign substrates are generally polycrystalline in nature unless special conditions prevail. As an example, layers of GaAs, GaAlAs, GaAsP, Si, Ge and others are polycrystalline when grown upon quartz, which is a transparent insulating material. Under special conditions in which the substrate is monocrystalline and the lattice parameters of the semiconductor are close to those of the substrate, and where the temperature and other growth conditions are carefully chosen, a monocrystalline epitaxial semiconductor layer can be grown upon a transparent insulating substrate. Polycrystalline layers on transparent insulating substrates can form the basis for low cost, moderately high efficiency tandem solar cells while monocrystalline layers on transparent insulating substrates can form the basis for higher efficiency structures which may be more costly but which can be used in concentrating systems where efficiency is more important than cost (see the Hovel article mentioned above).

The following United States of America Patents are of special background interest concerning the solar cells of this invention:

(1) Abrahamsohn (U.S. Pat. No. 3,376,163) discloses a photosensitive device composed of two photovoltaic cells applied to opposite sides of clear glass substrate.

(2) Jackson (U.S. Pat. No. 2,949,498) teaches the use of a variety of semiconductor materials, such as GaAs, InP, Si and Ge, in multilayer solar energy converters wherein each layer has a different energy gap.

(3) Milnes (U.S. Pat. No. 4,094,704) also shows overlying and underlying solar cells on opposite sides of a transparent substrate, wherein the layers may be such as GaAs, GaAlAs, Si.

(4) Mann (U.S. Pat. No. 3,450,568) pertains to solar cells with wrap-around electrodes.

Thus, tandem superimposed cells have been shown for the prior art practice in U.S. Pat. Nos. 2,949,498; 3,376,163 and 4,094,704 wherein the cells either are separate or are associated with the substrate by layers that attenuate the performance. Wrap-around contacts have for other structures been shown in U.S. Pat. No. 3,450,560.

SUMMARY OF THE INVENTION

It is an object of this invention to provide a solar cell with both a transparent substrate and active materials which are responsive to different wavelengths of light on opposite sides of the substrate.

It is another object of this invention to provide a structure for practice of the foregoing object in which: an optically transparent substrate is selected from the group consisting of $Al_2O_3$, Spinel, Quartz, BeO, Glasses and Aluminas; a layer is presented on one surface thereof, which is selected from the group consisting of GaAs, GaAlAs, GaP and InP, having a first energy gap; and a layer is presented on the opposite surface thereof which is selected from the group consisting of Si, Ge, GaSb, or GaInAs having a second energy gap.

Illustratively, the invention hereof is distinguished from the prior art noted hereinbefore by the use of a transparent insulating substrate with semiconductor layers grown on each side, in which a reflective metal layer is present on the bottom side, and in which this metal layer can be used to electrically connect the semiconductor layers of different bandgaps to obtain a multiple bandgap tandem solar cell.

PRACTICE OF THE INVENTION

The invention is an improved efficiency solar cell involving two superimposed solar cell layers grown upon a transparent substrate with a reflective metal contact that can also serve as a wrap-around contact. An exemplary structure is GaAlAs and Si on a substrate selected from the group consisting of $Al_2O_3$, Spinel, Quartz and BeO.

Through the practice of this invention, many of the difficulties of the prior art of cascade solar cells are overcome by introducing a substrate which is transparent, and materials of different bandgaps which are grown upon each side of the substrate.

Figure 1:
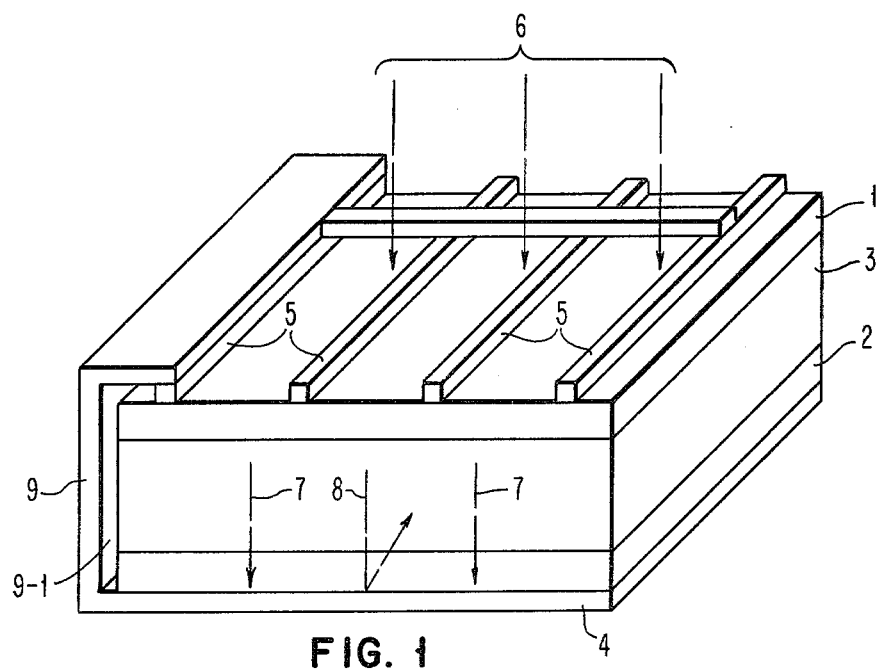
FIG. 1 is a schematic representation of the general form of the tandem cell of the invention showing transparent substrate, semiconductor layers, reflective metal layer and wrap-around connection.

An embodiment of the invention is shown in FIG. 1 wherein semiconductor layers 1 and 2 are deposited upon a transparent insulating substrate 3. A reflective metal layer 4 covers the bottom layer 2, while a grid of metal 5 forms ohmic contact to the top layer 1. Light 6 enters through the top layer 1 which has a larger energy bandgap than layer 2. A portion of the light 7 whose photons have less energy than the energy bandgap of layer 1 is transmitted through the substrate to the semiconductor layer 2. A portion of the light 8 not absorbed by layer 2 on the first pass is reflected by the metal layer 4 and can be absorbed on the second pass. A metal layer 9 can be used to wrap-around the edges of the structure to ohmically connect the two solar cells. Region 9-1 may be an actual physical separation between wrap-around metal 9 and the regions 1, 2 and 3, or it may be an insulator acting as a stand-off to separate metal 9 from the semiconducting regions 1 and 2. In cases where metal 9 forms a low leakage electrical contact to semiconductor layers 1 and 2, metal 9 may touch layers 1 and 2 (as well as substrate 3) and the region shown as 9-1 will be absent. The layers 1 and 2 may be polycrystalline in general, but if the substrate and semiconductor layers and growth conditions are chosen correctly, they may be epitaxial and monocrystalline. Techniques for choosing such conditions and materials are well known to crystal growth specialists.

Figure 2:
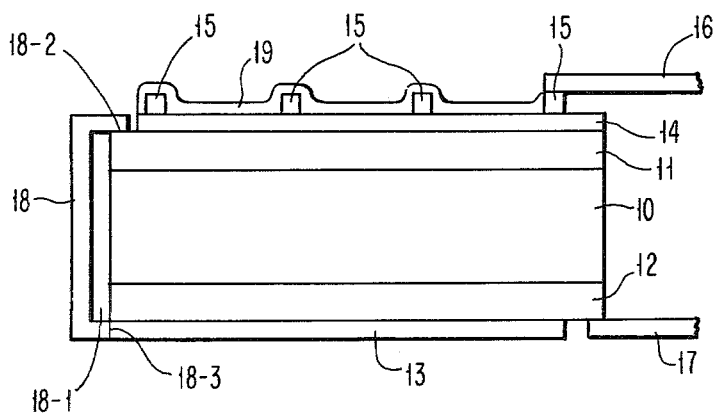
FIG. 2 is a cross-sectional view of one embodiment of the tandem cell of this invention in which both photoactive solar cell devices are made with Schottky barriers and the semiconductors are of the same conductivity type.

The necessary devices made on layers 1 and 2 can be formed with Schottky barriers, p-n homojunctions, or heterojunctions. FIG. 2 shows an example of a structure using two Schottky barriers. Semiconductor layers 11 and 12 are deposited upon transparent insulating substrate 10. These semiconductor layers may be, for example, n-type conducting layers. Schottky barriers are formed by metal layers 13 and 14. Layer 14 is very thin, 60 to 200 Angstroms thick, so it is highly transparent to visible light. A grid 15 makes contact to the thin layer 14. The output electrodes are 16 and 17. Layer 17 makes an ohmic contact to semiconductor 12 while wrap-around metal 18, shown connected to metal layer 13 at 18-3, makes ohmic contact to semiconductor 11. Region 18-1 may be an actual physical separation between wrap-around metal 18 and regions 10, 11 and 12 or it may be an insulator acting as a stand-off to separate metal 18 from the semiconducting regions 11 and 12. Metal 18 touches and makes ohmic contact to layer 11 at point 18-2. In cases where metal 18 forms a low leakage electrical contact to semiconductor layer 12, metal 18 may touch layer 12 (as well as substrate 10 and layer 11) and the region shown as 18-1 will be absent. Layer 13 is a thick optically reflective metal layer. An anti-reflection layer 19 can be used to maximize the transmittance of light through the thin metal layer 14.

Figure 3:
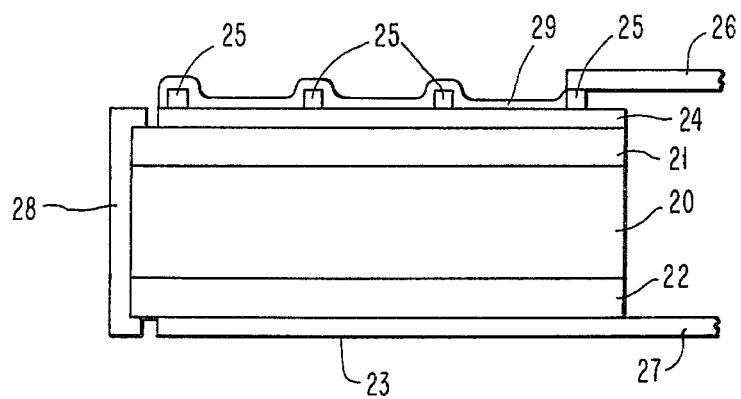
FIG. 3 is a cross-sectional view of another embodiment of the tandem cell of this invention in which both photoactive solar cell devices are made with Schottky barriers and the semiconductors have opposite conductivity types.

Slightly different configurations for practice of this invention can be utilized, if desired, while still maintaining the basic principles of the invention. FIG. 3 shows an example of a tandem structure which utilizes opposite conductivity-type semiconductors with Schottky barriers. N-type semiconductor 21 and p-type semiconductor 22 are deposited on opposite sides of transparent insulating substrate 20. Reflective metal layer 23 forms a Schottky barrier to layer 22 while thin semi-transparent metal layer 24 forms a Schottky barrier with layer 21. A metal grid 25 contacts the metal layer 24 while electrodes 26 and 27 lead to the electrical load. Wrap-around metal layer 28 makes ohmic contact to both semiconductor layers 21 and 22, and may touch substrate 20. An anti-reflection coating 29 is shown covering layer 24 and grid 25.

The structure of FIG. 3 can be made using p-type silicon as layer 22 and n-type GaAlAs or GaAsP as layer 21. Metal layer 23 is Al and layer 24 is Au. Grid 25 can be made with Au and wrap-around metal 28 is made with Ti/Ag. Anti-reflecting layer 29 is made with $TiO_2$. The substrate 20 is $Al_2O_3$.

Figure 4:
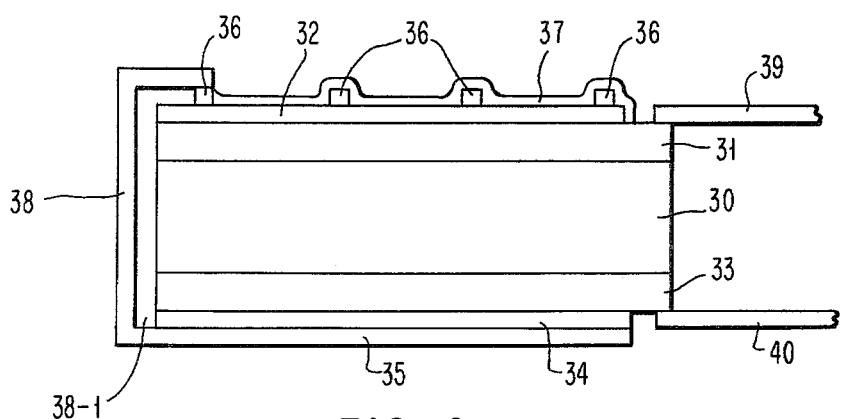
FIG. 4 is a cross-sectional view of another embodiment of the tandem cell of this invention in which the photoactive solar cell devices are made with p/n homojunctions.

An example of a structure utilizing p/n junctions is shown in FIG. 4. Transparent insulating substrate 30 has semiconductor layers 31 and 32, and 33 and 34 on respective sides. Semiconductor layers 31 and 32 form a p/n junction and semiconductor layers 33 and 34 form another p/n junction. Reflective metal 35 forms an ohmic contact with layer 34 and a metal grid 36 makes an ohmic contact with layer 32. A wrap-around contact 38 is used to connect the two p/n junctions into electrical series. Region 38-1 may be an actual physical separation between wrap-around metal 38 and the regions 30, 31 and 33, or it may be an insulator acting as a stand-off to separate metal 38 from the semiconducting regions 31 and 33. In cases where metal 38 forms a low leakage electrical contact to semiconducting layers 31 and 33, metal 38 may touch layers 31 and 33 (as well as substrate 30) and the region shown as 38-1 will be absent. Metal layer 38 may touch regions 34 and 32. An anti-reflection layer 37 covers the top surface. Electrodes 39 and 40 make ohmic contact to layers 31 and 33, respectively.

The two p/n junctions in FIG. 4 formed by layers 31/32 and 33/34 may be p/n homojunctions or p/n heterojunctions or one of each. For example, layers 33 and 34 may be of the same semiconductor material to form a homojunction while layers 31 and 32 may be of different semiconductor materials to form a heterojunction. Both materials 31 and 32 must then have larger bandgaps than the material comprising layers 33 and 34.

One embodiment of the structure of FIG. 4 would start with a substrate 30 of $Al_2O_3$ upon which there is deposited by vapor growth a region 33 of p-type Ge and a region 34 of n-type Ge. On the opposite face of the $Al_2O_3$ a layer 31 of n-type GaAs and a layer 32 of p-type GaAlAs would be deposited. Layers 35, 36, 38, 39 and 40 can all be made with Ti/Pd/Ag, which makes an ohmic contact to each semiconductor layer. Anti-reflecting layer 37 is made with $TiO_2$.

Each of the FIGS. 1 to 4 has shown a wrap-around contact with connects the two solar cells into electrical series. This wrap-around connector can be left off if desired and the two solar cells operated in separate circuits. The use of an insulating transparent substrate insures that complete electrical isolation can be achieved. If the two solar cells are operated in separate circuits, each solar cell must have two electrodes.

Suitable transparent substrate materials include spinel, quartz, berylium oxide, zinc sulfide, sapphire, alumina, and glass. Suitable semiconductor materials include Ge, crystalline Si, GaSb, InP, GaAs, GaInAs, GaAsP, GaAlAs, CdS, CdSe, CdTe, amorphous Si and GaP.

Each of the structures of FIGS. 1-4 can be made with either polycrystalline or monocrystalline semiconductor layers. For highest efficiency of conversion of solar energy to electrical energy, single crystal layers are desired with electrical properties as close to bulk properties as possible. A crystal perfection accommodation region may then be desirable between the substrate and the active semiconductor layer. Such a layer may be a wide bandgap semiconductor which "grades" the lattice properties of the substrate toward those of the active semiconductor layer and therefore reduces the defect density that would occur in the active layer.

ASPECTS OF THE INVENTION

Aspect 1 of the invention is a solar cell structure having a transparent insulating substrate with photoactive material thereon responsive to different wavelengths of light on opposite sides and having a reflective metal layer on one said photoactive material on the side away from the incident light.

Aspect 2 of the invention is the structure of Aspect 1 wherein said reflective metal layer forms a Schottky barrier with said photoactive material.

Aspect 3 of the invention is a solar cell structure having a transparent insulating substrate with solar cell devices thereon each side of said substrate, and the solar cell material on the light incident upper side having a larger energy bandgap than the solar cell material on the opposite bottom side and the opposite bottom solar cell device being covered with a reflective metal layer which wraps around the edge to make electrical contact to a portion of the incident solar cell device.

Aspect 4 of the invention is the structure of Aspect 3 wherein the incident solar cell device is made with a transparent Schottky barrier.

Aspect 5 of the invention is the structure of Aspect 3 wherein said solar cell devices are made with p/n homojunctions.

Aspect 6 of the invention is a solar cell structure comprising: an optically transparent substrate selected from the group consisting of $Al_2O_3$, Spinel, Quartz, BeO, Glasses and Aluminas, a layer on one surface of said substrate taken from the group of GaAs, GaAlAs, GaP, GaAsP, amorphous Si, CdS, CdSe and CdTe forming one solar cell device and having a first energy gap; and a layer on the opposite surface of said substrate selected from the group consisting of crystalline Si, Ge, GaSb, GaInAs, and InP forming a second solar cell device and having a second energy gap; and a reflective metal layer covering the semiconductor layer opposite the incident light surface.

Aspect 7 of the invention is the structure of Aspect 6 wherein said reflective metal layer wraps around the edges to connect the solar cell devices in electrical series.

Aspect 8 of the invention is the structure of Aspect 7 wherein said solar cell devices are formed by Schottky barriers.

Aspect 9 of the invention is the structure of Aspect 7 wherein said solar cell devices are formed by p/n homojunctions.

Aspect 10 of the invention is a solar cell structure comprising: an optically transparent, electrically insulating substrate, at least one semicondcutor material on a first upper surface of said substrate, at least one semiconductor material on a second lower surface of said substrate, the semiconductor materials being made to contain photoactive devices, the upper semiconductor material having larger energy bandgap than at least one of the lower semiconductor materials, a reflective metal layer covering the bottom surface of the lower semiconductor materials, said reflective metal layer wrapping around the edge to connect the two solar cell devices in electrical series.

Aspect 11 of the invention is the structure of Aspect 10 wherein one of said upper and lower semiconductor acts as a crystal perfection accomodation region.

Aspect 12 of the invention is a solar energy converter comprising: a first light energy frequency responsive energy conversion region in epitaxial relationship with a first major surface of a transparent substrate member having said first and second major surfaces, a second light energy frequency responsive solar energy conversion region in epitaxial relationship with said second major surface of said substrate, means providing concentrated light that passes through said first energy conversion region, said substrate and said second energy conversion region being in optical series and a reflective member being in contact with the exposed major surface of said second region, said reflective member being continuous around the periphery of said converter and providing electrical contact to both said first region and said second region.

Having thus described my invention, what I claim as new, and desire to secure by Letters Patent is:

1. A solar cell structure comprising:
   an optically transparent, electrically insulating substrate,
   at least one semiconductor material on a first upper surface of said substrate,
   at least one semiconductor material on a second lower surface of said substrate,
   the upper semiconductor material having larger energy bandgap than at least one of the lower semiconductor materials,
   first and second photoactive solar cell means in said upper and lower semiconductor materials respectively, at least one of said solar cell means having a Schottky barrier, and
   a reflective metal layer covering the bottom surface of the lower semiconductor materials,
   said reflective metal layer wrapping around the edge to connect the two solar cell devices in electrical series.

2. The structure of claim 1 wherein one of said upper and lower semiconductors acts as a crystal perfection accommodation region.

3. A solar energy converter comprising:
   a first light energy frequency responsive energy conversion region in epitaxial relationship with a first major surface of a transparent substrate member having said first and second major surfaces,
   a second light energy frequency responsive solar energy conversion region in epitaxial relationship with said second major surface of said substrate,
   means for providing concentrated light that passes through said first energy conversion region,
   said substrate and said second energy conversion region being in optical series, and a reflective metal member in contact with the exposed major surface of said second region, said reflective metal member forming a Schottky barrier to said exposed major surface of said second region, said reflective member being continuous around the periphery of said converter and providing electrical contact to both said first region and said second region.

4. A solar cell structure having a transparent insulating substrate with photoactive material thereon responsive to different wavelengths of light on opposite sides and having a reflective metal layer on one said photoactive material on the side away from the incident light forming a Schottky barrier with said photoactive material.

5. A solar cell structure having a transparent insulating substrate with respective solar cell devices thereon on each side of said substrate, the solar cell material of said solar cell on the light incident side having a larger energy bandgap than the solar cell material on the opposite side and said incident solar cell device being made with a transparent Schottky barrier, and the opposite solar cell device being covered with a reflective metal layer which wraps around the edge to make electrical contact to a portion of the incident solar cell device.

6. A solar cell structure comprising:

an optically transparent substrate selected from the group consisting of $Al_2O_3$, Spinel, Quartz, BeO, Glasses and Aluminas;

a layer on one surface of said substrate taken from the group of GaAs, GaAlAs, GaP, amorphous Si, GaAsP, CdS, CdSe and CdTe forming one solar cell device having a first Schottky barrier and having a first energy gap;

a layer on the opposite surface of said substrate selected from the group consisting of crystalline Si, Ge, GaSb, GaInAs, and InP forming a second solar cell device having a second Schottky barrier and having a second energy gap; and a metal layer wrapping around the edges to connect said solar cell devices in electrical series.

7. A solar cell structure comprising:

an optically transparent, electrically insulating substrate, at least one semiconductor material on a first upper surface of said substrate, at least one semiconductor material on a second lower surface of said substrate, the upper semiconductor material having larger energy bandgap than at least one of the lower semiconductor materials, first and second photoactive solar cell means in said upper and lower semiconductor materials respectively, at least one said solar cell means having a Schottky barrier, and a reflective metal layer covering the bottom surface of the lower semiconductor materials.

8. The structure of claim 7 in which a metal layer wraps around the edge to connect the two solar cell devices in electrical series.

9. A solar energy converter comprising:

a first light energy frequency responsive energy conversion region in epitaxial relationship with a first major surface of a transparent substrate member having said first and second major surfaces, a second light energy frequency responsive solar energy conversion region in epitaxial relationship with said second major surface of said substrate, means for providing concentrated light that passes through said first energy conversion region, said substrate and said second energy conversion region being in optical series, and a reflective metal member in contact with the exposed major surface of said second region, said reflective metal member forming a Schottky barrier to said exposed major surface of said second region.

10. The structure of claim 9 in which said reflective member is continuous around the periphery of said converter and providing electrical contact to both said first region and said second region.

* * * * *